United States Patent [19]

Okuzumi et al.

[11] Patent Number: 4,884,476
[45] Date of Patent: Dec. 5, 1989

[54] METHOD FOR THE PREPARATION OF A DIAMOND-CLAD MACHINING TOOL

[75] Inventors: Fuminori Okuzumi, Tokyo; Junichi Matsuda, Yokohama, both of Japan

[73] Assignee: Asahi Diamond Industrial Co., Ltd., Tokyo, Japan

[21] Appl. No.: 206,228

[22] Filed: Jun. 13, 1988

[30] Foreign Application Priority Data

Dec. 10, 1987 [JP] Japan ............................ 62-312985

[51] Int. Cl.⁴ .................. B23B 27/20; B23B 27/18
[52] U.S. Cl. ................ 76/101 R; 76/DIG. 12; 407/118; 125/39
[58] Field of Search ............. 76/DIG. 12, DIG. 11, 76/101 R, 101 A; 407/118, 119; 125/39

[56] References Cited

U.S. PATENT DOCUMENTS 3,702,573  11/1972  Nemeth ............................ 407/119
3,868,750  3/1975   Ellis et al. ........................ 407/119
4,194,790  3/1980   Kenny et al. .................... 407/118

FOREIGN PATENT DOCUMENTS 142003   6/1986   Japan ............................ 407/119
1159302  7/1986   Japan ............................ 407/119
252004   11/1986  Japan ............................ 407/119

Primary Examiner—Roscoe V. Parker
Attorney, Agent, or Firm—Frishauf, Holtz, Goodman & Woodward

[57] ABSTRACT

A diamond-clad machining tool is prepared by the steps of (a) forming a film of diamond of 10 to 1000 μm thickness by the method of vapor-phase deposition on the surface of a temporary substrate of, e.g., silicon, (b) bonding the diamond film as borne by the temporary substrate to the surface of a base body of the tool by brazing and (c) removing the temporary substrate, e.g., by grinding to leave the diamond film bonded to the base body of the tool by brazing. The method is advantageous in the versatility in respect of the material of substrate on which a diamond film is deposited from the vapor phase as well as in the firmness of bonding between the cladding layer and the base body of the tool in comparison with the conventional vapor-phase deposition method of diamond directly to the surface of the base body of a tool.

15 Claims, 3 Drawing Sheets

METHOD FOR THE PREPARATION OF A DIAMOND-CLAD MACHINING TOOL

BACKGROUND OF THE INVENTION

The present invention relates to a method for the preparation of a diamond-clad machining tool or, more particularly, to a method for the preparation of a machining tool having a cladding layer of diamond formed by the method of chemical vapor-phase deposition.

As is well known, diamond is the most useful and preferred to various kinds of carbide-based cemented hard alloys as a material of tools for machining such as cutting, lathing, shaping, planing and milling, of which extremely high hardness and wearing resistance are required. Diamond materials conventionally used in machining tools include polycrystalline sintered bodies of powdery diamond and natural and synthetic single crystals of diamond and they are all suitable as a material of machining tools by virtue of their extremely high hardness and wearing resistance as well as excellent resistance against welding to the workpieces under machining.

In addition to the above mentioned conventional diamond materials, several attempts and proposals have been made recently to prepare a diamond-clad machining tool by utilizing the so-called chemical vapor-phase deposition method in which a thin film of diamond is deposited from the vapor phase as a cladding layer on the base body of a machining tool made of a metal or a cemented carbide so as to give a diamond-clad machine tool. Such an attempt hitherto undertaken is not successful to manufacture diamondclad machining tools useful in practical machining works.

One of the serious problems in the preparation of a diamond-clad machining tool by the method of chemical vapor-phase deposition is that a sufficiently high adhesive bonding strength can hardly be obtained between the vapor phase-deposited film of diamond and the surface of the base body of the tool made of a metal or a cemented carbide. Moreover, this problem is more serious when the cladding layer of diamond has a larger thickness. For example, exfoliation of the cladding layer of diamond readily takes place when a cutting tool having a cladding layer of diamond deposited on a base body of a cemented carbide is used in cutting work.

Another problem in the chemical vapor-phase deposition of diamond in the prior art method is that the selection of the material forming the base body on which diamond is deposited is limited because the efficiency of the vapor phase deposition of diamond is greatly influenced by the kind of the material. For example, the efficiency of deposition of diamond is very low on a base body of iron, steel or other ferrous alloys so that diamond-clad machining tools can hardly be prepared by use of such a base body.

Moreover, the cladding layer of diamond formed by the chemical vapor-phase deposition method has a rough surface especially when the diamond layer has a relatively good crystallinity so that machining tools having a cladding layer of diamond as deposited have limited application fields as a wear resistant tool. Accordingly, lapping of the diamond surface as deposited is sometimes indispensable in order to increase the surface smoothness of the cladding layer. The lapping work naturally reduces the thickness of the cladding layer sometimes by 10 $\mu$m or more so that the diamond layer as deposited must have a thickness so much larger than necessary in the finished tool after lapping while, as is mentioned above, the bonding strength between the cladding layer of deposited diamond and the base body of to tool is decreased as the thickness of the cladding layer is increased, for example, to exceed 10 $\mu$m.

SUMMARY OF THE INVENTION

The present invention accordingly has an object to provide a novel and reliable method for the preparation of a machining tool having a cladding layer of diamond formed by the method of chemical vapor-phase deposition without the above described problems and disadvantages in the prior art method.

Thus, the method of the present invention for the preparation of a machining tool having a cladding layer of diamond formed by chemical vapor-phase deposition comprises the successive steps of:

(a) forming a film of diamond having a thickness in the range from 10 to 1000 $\mu$m by chemical vapor-phase deposition on the surface of a temporary substrate;

(b) brazing the film of diamond on the temporary substrate to the surface of a base body of a tool; and (c) removing the temporary substrate leaving the film of diamond brazed to the surface of the base body of the tool.

DETAILED DESCRIPTION OF THE PREFERRED EMBODIMENTS

Figure 1:
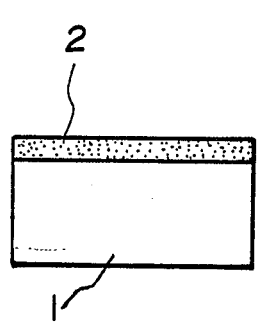
FIGS. 1 to 3 are for schematically illustrating the steps of the inventive method each by a cross section and FIG. 4 is a perspective view of a machining tool thus prepared.

The above defined method of the present invention comprising the steps (a), (b) and (c) is applicable to the preparation of machining tools which require hardness of the surface and wearing resistance including cutting tools, dies, taps, gages, trimming dies, wire-drawing dies and the like.

The material of the temporary substrate on which a film of diamond is formed by the method of chemical vapor-phase deposition is not particularly limitative provide that deposition of diamond can proceed efficiently in the step (a) and the temporary substrate can be removed from the film of diamond in the step (c) without difficulty by a suitable method such as shaving and grinding. Suitable materials of the temporary substrate in the inventive method include silicon, molybdenum, tungsten and the like of which silicon is particularly preferably in respect of the easiness in removal of the temporary substrate by grinding or other simple methods. Since the temporary substrate is to be removed after the film of diamond deposited thereon is bonded by brazing to the surface of the base body of a tool, a variety of materials can be used as the temporary substrate and a vapor phase-deposited diamond film of any large thickness can be formed thereon regardless of the problem that the bonding strength between the vapor phase-deposited diamond film and the substrate surface is decreased as the thickness of the diamond film is increased. This is a great advantage over conventional diamond-clad machining tools prepared by the method of chemical vaporphase deposition on a base body of a limited material.

The vapor phase-deposited diamond film formed on the surface of the temporary substrate should have a thickness in the range from 10 to 1000 μm. When the thickness is too small, some difficultes are caused in the removal of the temporary substrate by grinding after the diamond film on the temporary substrate is bonded to the base body of the tool by brazing because such a thin diamond film may be badly damaged unless the grinding work is performed with utmost care. On the other hand, no further improvement can be obtained in the performance of the diamond-clad machining tool even by increasing the thickness of the vapor phase-deposited diamond film to exceed the above mentioned upper limit if not to mention the decreased in the productivity due to the unduly long time taken for the process of vapor-phase deposition of the diamond film having such a large thickness.

The method of the vapor-phase deposition of a diamond film is not limited to the chemical vapor-phase deposition but physical vapor-phase deposition is also applicable. The method of chemical vapor-phase deposition is well known in the art including pyrolytic vapor-phase deposition, plasmainduced vapor-phase deposition, ion-beam chemical vapor phase deposition and the like.

The base body of a tool, to which the vapor phasedeposited diamond film on the temporary substrate is bonded by brazing, is not particularly limitative in respect of the material forming the same provided that the body has sufficiently high hardness and strength suitable for use as a machining tool and the surface thereof is fully receptive of brazing so as to give a satisfactory bonding strength with the diamond film. Almost all of the materials conventionally used for the preparation of machining tools can be used as a material of the base body of a tool in the inventive method including cemented carbides such as tungsten carbide and the like, metallic materials such as carbon tool steel, alloyed tool steel, high-speed tool steel and the like and non-metallic fine ceramics such as alumina, zirconia and the like.

In the step (b) of the inventive method, the diamond film deposited from the vapor phase on to the surface of the temporary substrate in the step (a) is bonded by brazing to the surface of the base body of a tool mentioned above as borne by the temporary substrate. Advantageously, the bonding strength obtained by brazing between the diamond film and the base body of a tool can be much stronger than the bonding strength between the base body of a tool and a diamond film directly deposited from the vapor phase by appropriately selecting the brazing material. Though not particularly limitative, the melting point of the brazing material used in the inventive method is preferably in the range from 700° to 900° C. Any of known brazing materials conventionally used for bonding of natural and synthetic diamond crystals can be used satisfactorily in the inventive method to give a high bonding strength between the vapor phase-deposited diamond film and the base body of a tool.

It is of course important to properly select the brazing material to match the nature of the material forming the base body of a tool to which the diamond film is bonded by brazing. When the base body of a tool is made of a metallic material or a cemented carbide, for example, preferable brazing materials include those based on a titanium-copper-silver alloy, copper-nickel-titanium alloy, silver-copper-palladium alloy and the like. When the base body of a tool is made of a fine ceramic, brazing materials based on a titanium-copper-silver alloy are preferred. Other materials of the base body of a tool may require different brazing materials which can easily be selected by conducting a preliminary test for various known brazing materials.

The brazing work in the step (b) of the inventive method is performed by pressing together the diamond film borne by the temporary substrate and the base body of a tool with a melt of the brazing material intervening therebetween.

The surface configuration of the base body of a tool, to which the vapor phase-deposited diamond film is bonded by brazing, is not limited to a flat plane but any curved or cornered surface of the base body can be successfully provided with a diamond film by brazing according to the inventive method. When a curved or cornered surface of the base body is desired to be provided with a diamond film by brazing, the base body is used as a male mold for the preparation of a temporary substrate as a female and the vapor-phase deposition of diamond is conducted on to the thus prepared temporary substrate so that the diamond film on the temporary substrate can exactly fit the surface configuration of the base body of a tool.

The step (c) of the invention method is to remove the temporary substrate from the diamond film after the diamond film has been firmly bonded to the base body by brazing. The method for removing the temporary substrate is not particularly limitative and can be preformed without difficulty including cutting, shaving, grinding and the like either singly or in combination.

In the following, the method of the invention is described in more detail by way of examples making reference to the accompanying drawing.

EXAMPLE 1

As is illustrated in FIG. 1, a film of diamond 2 having a thickness of 100 μm was formed on a temporary substrate 1 of metallic silicon by the method of plasmainduced chemical vapor-phase deposition taking 5 hours by keeping the substrate at a temperature of 800° C. The plasma was generated by applying a DC voltage between the electrodes in an atmosphere of a gaseous mixture of methane and hydrogen in a volume ratio of 1:100 under a pressure of 200 Torr.

Figure 2:
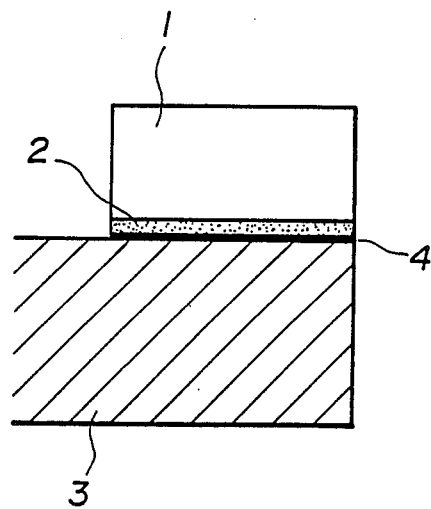
Figure 3:
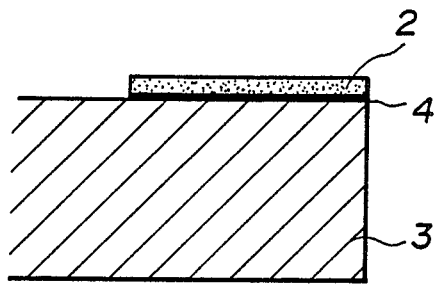
Figure 4:
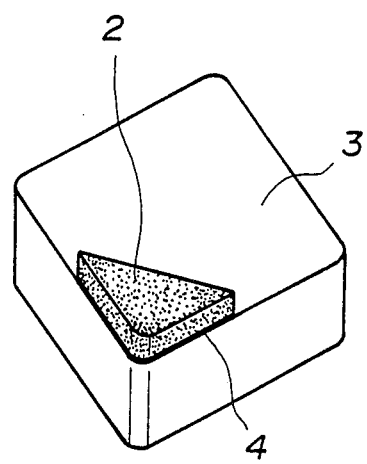

The thus formed diamond film 2 on the temporary substrate 1 was directly bonded, as is illustrated in FIG. 2, to the surface of a cutting chip 3 by the method of vacuum brazing using a brazing material 4. The brazing work was performed in just the smae manner as in the direct brazing of a natural diamond crystal to a shank using a brazing material of a titanium-copper-silver alloy (TICUSIL, a product of Wesgo Co.) under a pressure of $10^{-4}$ to $10^{-5}$ Torr. Thereafter, the temporary substrate 1 of silicon was removed by grinding to leave the diamond film 2 as bonded to the cutting chip 3 with the brazing material 4 as is illustrated in FIG. 3. FIG. 4 illustrates a perspective view of the thus obtained diamond-clad cutting chip after putting of edge on the cladding layer of diamond 2 bonded to the chip base 3 with the brazing material 4.

The above prepared diamond-clad cutting chip was mounted on a lathe (LS Lathe manufactured by Okuma Iron Works Co.) and subjected to a cutting test of an aluminum-8% silicon alloy under the conditions of cutting speed of 340 m/minute, feed of 0.15 mm/revolution and depth of cut of 0.15 mm. The result of the test was that the flank wear of the diamond-clad cutting chip was 2 μm after 100 minutes of continuous cutting indicating that the cutting performance of the inventive diamond-clad tool was equivalent to that of conventional sintered diamond chips.

EXAMPLE 2

Figure 5:
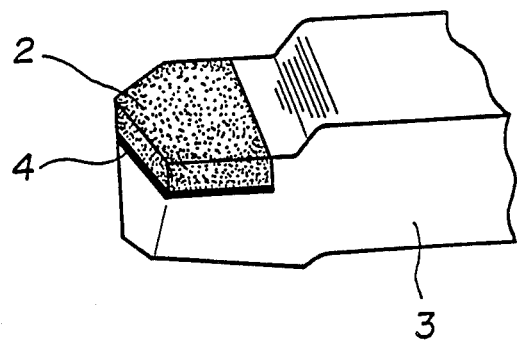
FIGS. 5 to 8 are each a perspective view of a different machining tool prepared by the inventive method.

A diamond-clad cutting tool illustrated in FIG. 5 was prepared according to the inventive method. A diamond film 2 having a thickness of 50 μm was formed on a temporary substrate of molybdenum by the method of chemical vaporphase deposition in substantially the same manner as in Example 1 and bonded to a base body 3 of the tool made of high-speed steel with the brazing layer 4 therebetween by the method of vacuum brazing. Thereafter, the temporary substrate of molybdenum was removed by grinding followed by edge-putting on the diamond layer.

The thus prepared diamond-clad cutting tool was subjected to a cutting test of an aluminum-8% silicon alloy under the same testing conditions as in Example 1 to find that the cutting performance thereof was equivalent to or even better than conventional cutting tools of sintered diamond.

EXAMPLE 3

Figure 6:
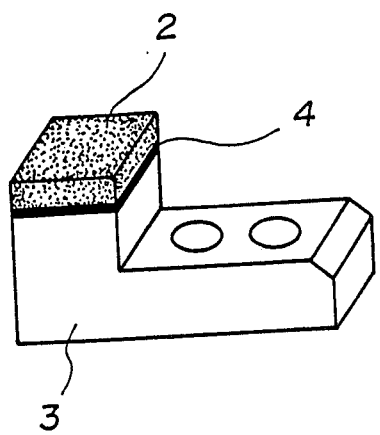

A diamond-clad cutting tool as illustrated in FIG. 6 was prepared according to the inventive method. A diamond film 2 having a thickness of 30 μm was formed on a temporary substrate of tungsten by the method of chemical vapor-phase deposition in substantially the same manner as in Example 1 and bonded to a base body 3 of a die steel-made block shoe by the method of vacuum brazing with a layer 4 of a brazing material therebetween. Thereafter, the temporary substrate of tungsten was removed by grinding to give the finished tool.

EXAMPLE 4

Figure 7:
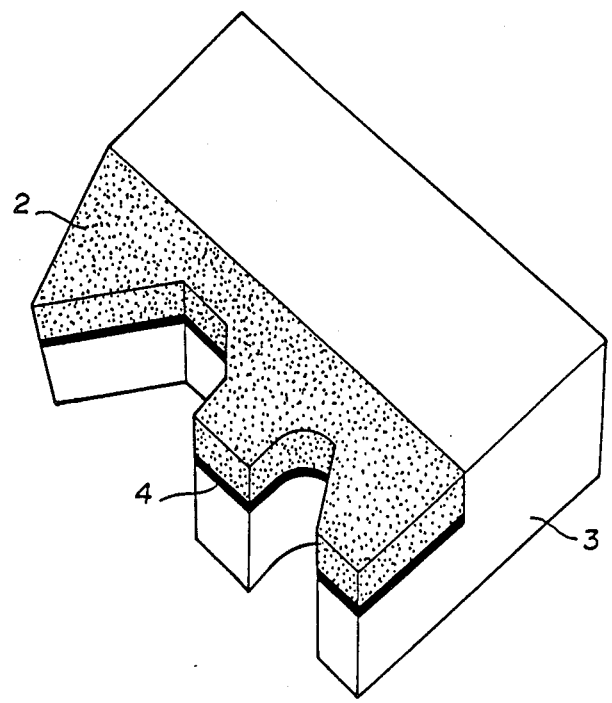

A diamond-clad digital-formed cutting tool as illustrated in FIG. 7 was prepared accoding to the inventive method. A diamond film 2 having a thickness of 150 μm was formed on a temporary substrate of metallic silicon in substantially the same manner as in Example 1 and bonded to a base body 3 of the tool made of carbon tool steel by the method of vacuum brazing with the layer 4 of a brazing material therebetween. Thereafter, the temporary substrate of silicon was removed by grinding to give the finished tool.

EXAMPLE 5

Figure 8:
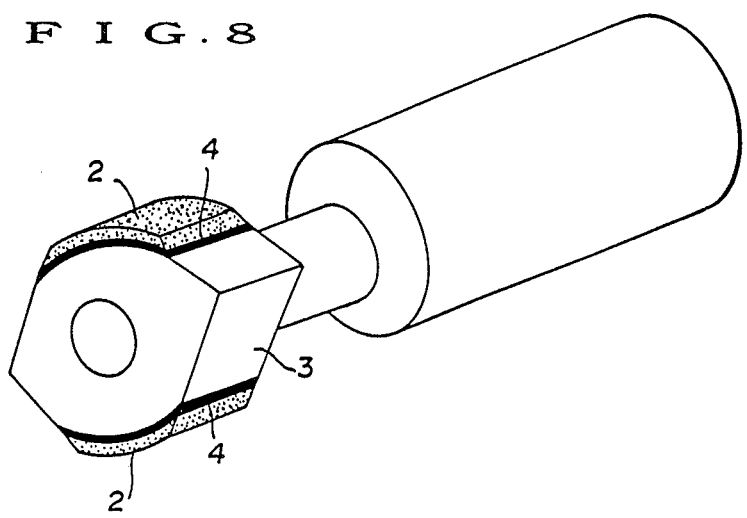

A diamond-clad machining tool having cylindrically curved diamond layers as illustrated in FIG. 8 was prepared according to the invention method. A diamond film 2 having a thickness of 100 μm was formed on the curved surface of a molybdenum-made temporary substrate, the curved surface being a replica of the curved surface of the base body 3 of the tool, by the method of chemical vapor-phase deposition in substantially the same manner as in Example 1. Two pieces of such a temporary substrate having a vapor phase-deposited diamond layer were prepared and they were bonded at the diamond surface to the respective curved surfaces of the base body 3 of the tool shank made of alloy tool steel by the method of vacuum brazing with the layer 4 of a brazing material therebetween, Thereafter, the temporary substrates of mlybdenum were removed by cylindrical grinding to give the finished tool.

As is understood from the above given description, the present invention provides a very efficient and reliable method for the preparation of a diamond-clad machining tool having a dense layer of diamond free from a binder and firmly bonded to the surface of the tool body with little limitation in respect of the material of the body. Namely, the diamond film formed by the method of vapor-phase deposition is a dense polycrystalline body containing no binder. This is a great difference from conventional sintered polycrystalline diamond tools prepared by sintering fine particles of diamond together with a binder such as cobalt metal. Therefore, the diamond-clad machining tool prepared according to the inventive method has extremely high wear resistance in comparison with sintered diamond tools to exhibit stable machining performance. As a polycrystalline material free from anisotropy, moreover, the edge-putting work can be performed more easily on the cladding layer of diamond formed by the inventive method than on a single-crystalline diamond. In addition, the method of the invention is versatile in respect of the configuration of the tool on which the cladding layer of diamond is to be provided as a feature of the vaporphase deposition method by suitably preparing a temporary substrate to match the surface configuration of the base body of the tool so that almost all types of wear-resistant machining tools can be prepared by the inventive method.

What is claimed is:

1. A method for the preparation of a machine tool having a cladding layer of diamond formed by the method of vapor-phase deposition which comprises the steps of:
   (a) forming a film of diamond having a thickness of from 10 to 1000 μm by vapor-phase deposition on the surface of a temporary substrate;
   (b) bonding the film of diamond as borne by the temporary substrate by brazing the surface of the diamond film with a brazing material to the surface of a base body of a machine tool; and
   (c) removing the temporary substrate from the film of diamond bonded to the surface of the base body of the machine tool with a brazing layer therebetween.

2. The method for the preparation of a machine tool having a cladding layer of diamond as claimed in claim 1 wherein said temporary substrate comprises a material selected from the group consisting of silicon, molybdenum and tungsten.

3. The method for the preparation of a machine tool having a cladding layer of diamond as claimed in claim 1 wherein said brazing material is selected from the group consisting of titanium-copper-silver base alloys, coppernickel-titanium base alloys and silver-copper-palladium base alloys.

4. The method for the preparation of a machine tool having a cladding layer of diamond as claimed in claim 1 wherein said cladding layer of diamond is formed by the method of plasma-induced chemical vapor-phase deposition in an atmosphere of a gaseous mixture of methane and hydrogen.

5. The method for the preparation of a machine tool having a cladding layer of diamond as claimed in claim 3 wherein said base body comprises a metallic base body or a cemented carbide base body and said film of diamond has a thickness of from 30 to 150 μm.

6. The method for the preparation of a machine tool having a cladding layer of diamond as claimed in claim 5 wherein said cladding layer of diamond is formed by the method of plasma-induced chemical vapor-phase deposition in an atmosphere of a gaseous mixture of methane and hydrogen.

7. The method for the preparation of a machine tool having a cladding layer of diamond as claimed in claim 6 wherein said temporary substrate consists essentially of a material selected from the group consisting of silicon, molybdenum and tungsten and said cladding layer of diamond has a thickness of from 30 to 150 μm.

8. The method for the preparation of a machine tool having a cladding layer of diamond as claimed in claim 7 wherein said temporary substrate consists of silicon.

9. The method for the preparation of a machine tool having a cladding layer of diamond as claimed in claim 1 wherein said base body of a machine tool is a ceramic material; said brazing material is a titanium-copper-silver base alloy and said temporary substrate consists essentially of a material selected from the group consisting of silicon, molybdenum and tungsten.

10. The method for the preparation of a machine tool having a cladding layer of diamond as claimed in claim 9 wherein said temporary substrate consists of silicon and said cladding layer of diamond has a thickness of from 30 to 150 μm.

11. A machine tool having a cladding layer of diamond which integrally comprises:
(a) a base body of a machine tool;
(b) a cladding layer consisting of diamond having a thickness of from 10 to 1000 μm which was formed by vapor deposition;
(c) a layer of brazing material positioned between the surface of the base body of the machine tool and said cladding layer of diamond and bonding the base body surface and the diamond cladding layer together,
said cladding layer consisting of diamond which was formed by vapor deposition on a temporary substrate which was removed from said diamond cladding layer after said diamond cladding layer was bonded to said base body by said layer of brazing material.

12. The machine tool having a cladding layer of diamond as claimed in claim 11 wherein the brazing material is selected from the group consisting of titanium-copper-silver base alloys, copper-nickel-titanium base alloys and silver-copper-palladium base alloys.

13. The machine tool having a cladding layer of diamond as claimed in claim 11 wherein said cladding layer of diamond has a thickness of from 30 to 150 μm.

14. The machine tool having a cladding layer of diamond as claimed in claim 12 wherein said base body comprises a metal or cemented carbide and wherein said cladding layer has thickness of from 30 to 150 μm.

15. The machine tool having a cladding layer of diamond as claimed in claim 11 wherein said base body is a ceramic, said brazing material is a titanium-copper-silver base alloy and said cladding layer has a thickness of from 30 to 150 μm.

* * * * *